United States Patent
Dexter et al.

(10) Patent No.: US 8,379,447 B2
(45) Date of Patent: Feb. 19, 2013

(54) MEMORY BIT REDUNDANT VIAS

(75) Inventors: Mark A. Dexter, McKinney, TX (US); Sarma S. Gunturi, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 288 days.

(21) Appl. No.: 12/827,084

(22) Filed: Jun. 30, 2010

(65) Prior Publication Data

US 2012/0002471 A1    Jan. 5, 2012

(51) Int. Cl.
*G11C 16/06* (2006.01)

(52) U.S. Cl. ......... 365/185.09; 365/200; 365/185.33; 365/185.21

(58) Field of Classification Search ......... 365/185.09, 365/200, 185.33, 185.21, 207, 205
See application file for complete search history.

(56) References Cited

U.S. PATENT DOCUMENTS

| | | | |
|---|---|---|---|
| 7,164,602 B2* | 1/2007 | Hamamoto et al. | 365/185.09 |
| 7,379,359 B2* | 5/2008 | Sakakibara | 365/200 |

* cited by examiner

*Primary Examiner* — David Lam

(74) *Attorney, Agent, or Firm* — Rose Alyssa Keagy; Wade J. Brady, III; Frederick J. Telecky, Jr.

(57) ABSTRACT

An integrated circuit containing a memory array with memory bits and a differential sense amplifier for reading the logic state of the memory bits. The integrated circuit also contains redundant vias which are in the via path that couples a bitline to Vss. Moreover, an integrated circuit containing a FLASH memory bit with redundant vias in the via path from the bitline to Vss.

8 Claims, 8 Drawing Sheets

MEMORY BIT REDUNDANT VIAS

FIELD OF THE INVENTION

This invention relates to the field of integrated circuits. More particularly, this invention relates to memory arrays.

DETAILED DESCRIPTION

Figure 1A:
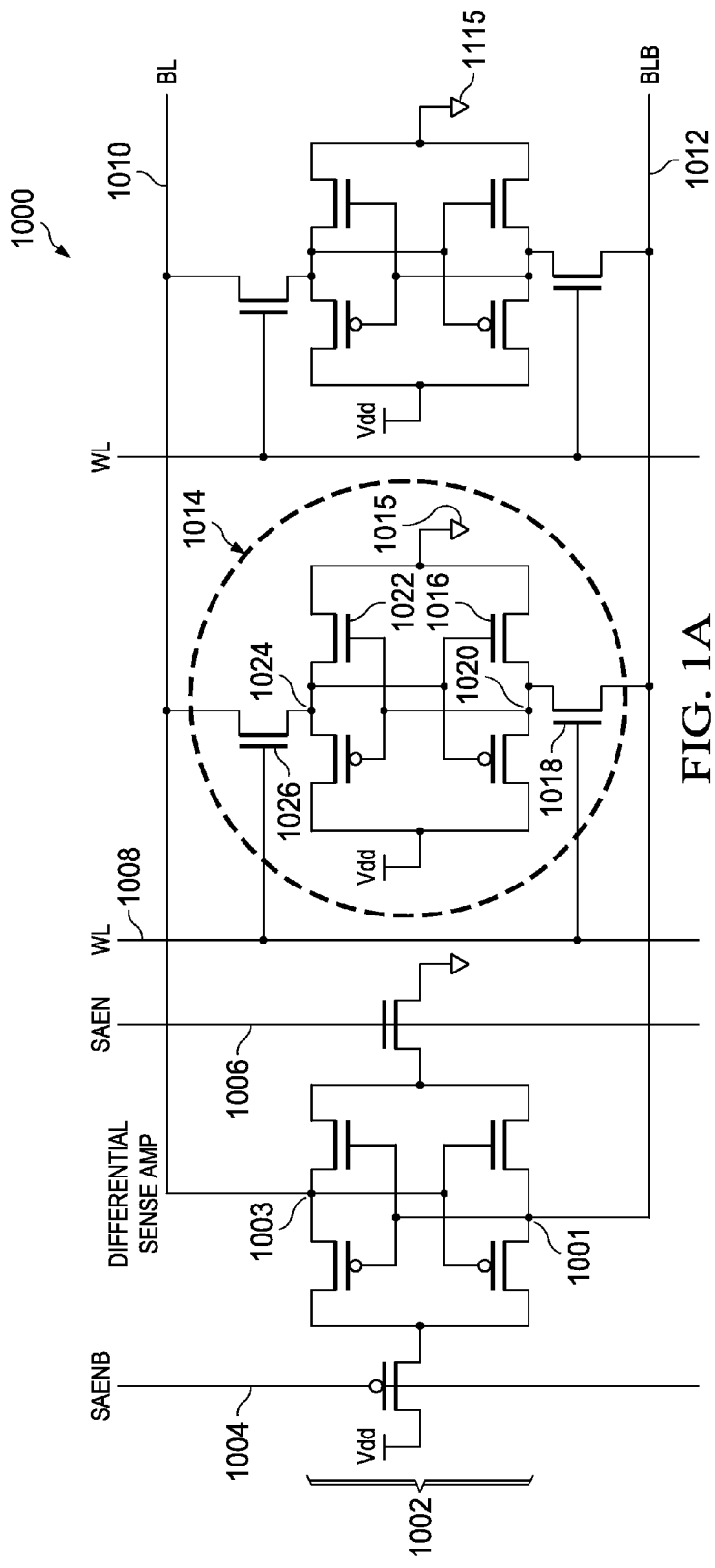
FIGS. 1A, 1B, and 1C are illustrative examples of the differential sensing of data in memories according to an embodiment.

Example embodiments described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide an understanding of the example embodiments. One skilled in the relevant art, however, will readily recognize that embodiments can be practiced without one or more of the specific details or with other methods. In other instances, well-known structures or operations are not shown in detail to avoid obscuring an embodiment. The example embodiments are not limited by the illustrated ordering of acts or events, as some acts may occur in different orders and/or concurrently with other acts or events. Furthermore, not all illustrated acts or events are required to implement a methodology in accordance with an embodiment.

Multiple vias are required for memory cell functionality and to read and write data to and from the memory cell. There are millions of these vias in a typical memory array. High resistance in even one of these vias may cause a memory bit to fail. Embodiments below illustrate methods of changing the layout of memory cells to enable the placement of vias without increasing the area of the memory cell.

A differential read is commonly used to read the logic state of memory bits in memory arrays. A differential read sense circuit (1000) with an SRAM memory bit according to an embodiment is shown in FIG. 1A. One of the pass gate transistors (1026) of SRAM memory bit (1014) may be connected to bitline (BL) (1010) using redundant vias and the other pass gate (1018) may be connected to bitline bar (BLB) (1012) through redundant vias. BL (1010) is coupled to one of the inputs (1003) of the differential sense amplifier (1002) and BLB (1012) is coupled to the other input (1001).

To illustrate a read operation of SRAM memory bit (1014), a logic state "1" is assumed to be stored in SRAM memory bit (1014) with storage node (1024) high (near Vdd) and storage node (1020) low (near Vss or ground). Initially, BL (1010) and BLB (1012) may be precharged high (near Vdd) and then floated (disconnected from the power supply). Next, wordline (1008) is brought high to turn on passgate transistors (1026) and (1018). The SRAM memory bit (1014) storage node (1024) is high and it is coupled to the gate of pulldown transistor (1016). Since the passgate transistor (1018) and the pulldown transistor (1016) are both turned on, BLB (1012) is discharged to ground (1015). SRAM memory bit (1014) storage node (1020) is low and is coupled to the gate of pulldown transistor (1022). Since pulldown transistor (1022) is off, BL (1010) is not discharged to ground (1015). The voltage on BL (1010) is high and the voltage on BLB (1012) is low when the sense amplifier (1002) is enabled by sending signals to sense amp enable (SAEN) (1006) and sense amp enable bar (SAENB) (1004). The differential voltage across the inputs (1001) and (1003) causes the sense amp (1002) to latch, thus reading a "1" in SRAM memory bit (1014). If there is high resistance in the path from BLB (1012) to ground (1015), the voltage on BLB (1012) may not discharge sufficiently fast for an adequate differential voltage to develop for the sense amplifier (1002) to latch into the correct state when SAEN (1006) and SAENB (1004) are turned on. This may result in a read error. As described below in FIGS. 3A through 3C and FIGS. 4A through 4C, the layout of an SRAM memory bit that does not have redundant vias may be changed and an SRAM memory bit (1014) with redundant vias may be formed without increasing the area of the SRAM memory bit.

Figure 1B:
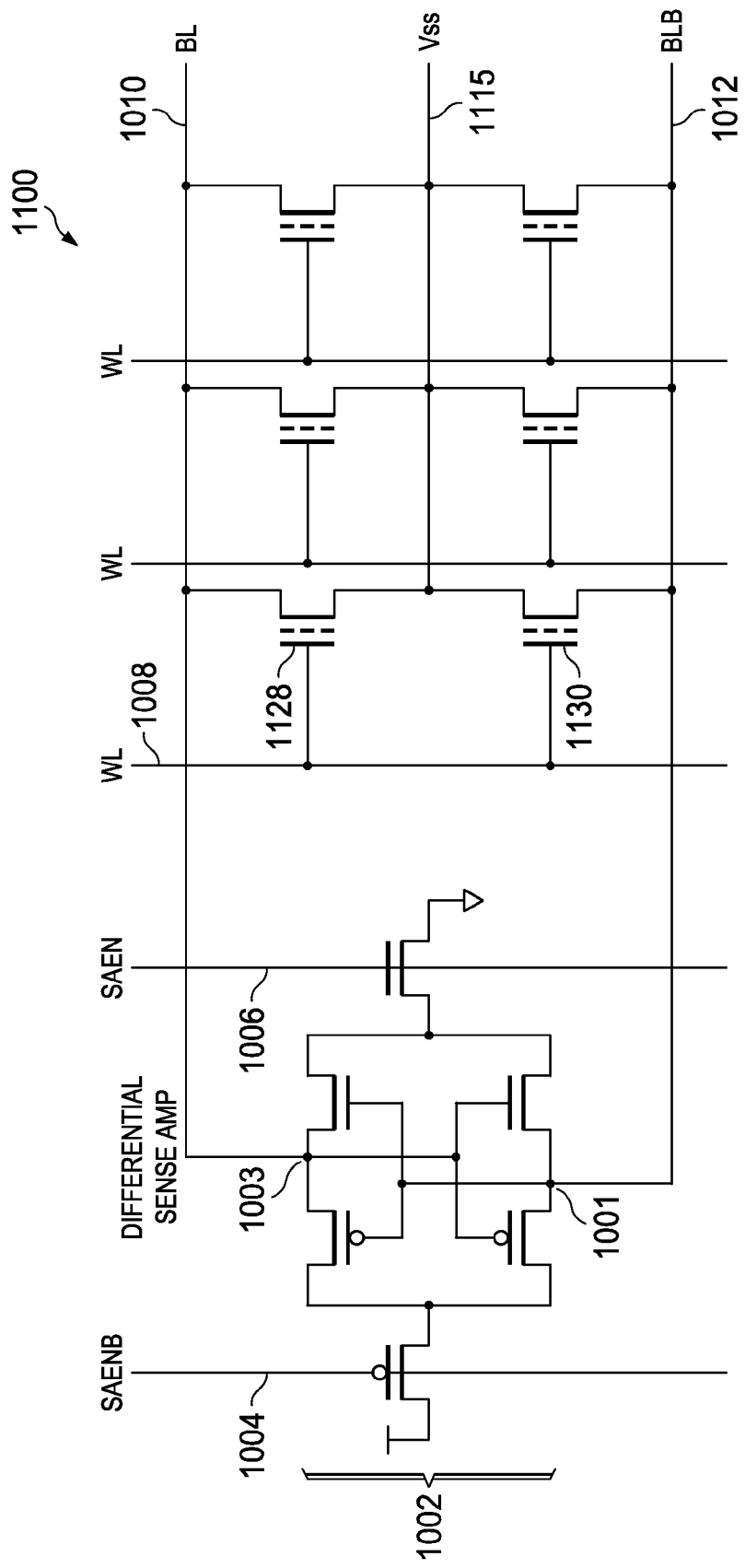

FIG. 1B is an example embodiment of the differential read of FLASH memory cells using a differential read sense circuit (1100). In this example, a FLASH memory is used for illustration, but another memory such as FRAM may also be used. In FIG. 1B, a first FLASH memory transistor (1128) is coupled between bitline (BL) (1010) and Vss (ground) (1115) using redundant vias and second FLASH memory transistor (1130) is coupled between bitline bar (BLB) (1012) and Vss (1115) also using redundant vias. In this two transistor ("2T") FLASH memory the floating gate on one FLASH transistor (transistor (1128), for example) may be programmed (e.g. with negative charge on the floating gate) and the floating gate on the other FLASH transistor (transistor (1130), for example) may be erased (e.g. no charge on the floating gate). During a read, BL (1010) and BLB (1012) are first precharged to Vdd and then floated (disconnected from the power supply). Wordline (WL) (1008) is then selected and a voltage is applied to the gates of the pair of FLASH transistors (1128) and (1130). Since there is negative charge on floating gate of FLASH transistor (1128), it does not turn on. Since the floating gate of FLASH transistor (1130) is erased, it does turn on. In this example, BLB (1012) discharges to ground whereas BL (1010) remains at Vdd. This applies a differential voltage across the inputs (1001) and (1003) of differential sense amplifier (1002) so that it latches, thus reading the logic state when activated by signals applied to sense amp enable (1006) and sense amp enable bar (1004). In a conventional FLASH memory array there may be individual vias between the conventional FLASH transistor and BLB (1012) and between the conventional FLASH transistor and Vss (1115). If an individual via has high resistance, the discharge of BLB (1012) may be sufficiently slowed so that an insufficient differential voltage is developed across the inputs, (1001) and (1003) of differential sense amp (1002) to latch it in the proper state. In this case, a read error may occur. A re-layout of the conventional FLASH memory bit may enable redundant vias to be added without increasing the area of FLASH bits 1130 and 1128.

Figure 1C:
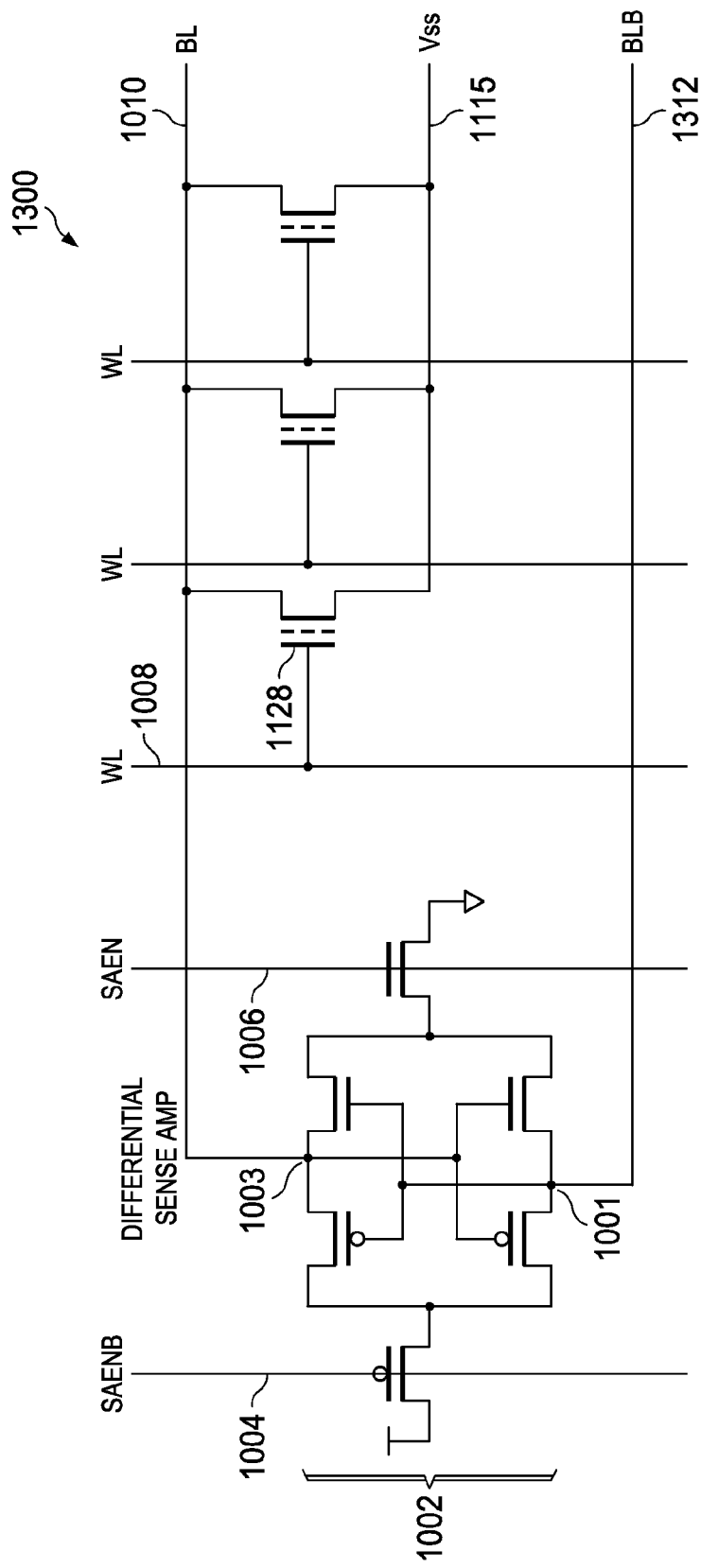

An additional embodiment example of a FLASH differential read that may be more sensitive than the 2T FLASH memory to resistance in the discharge path is shown in FIG. 1C. This memory is an example of a single cell, or 1T, FLASH memory. In a differential read sense circuit (1300) of a one cell differential memory, the bitline (BL) (1010) is coupled FLASH transistor (1128) through redundant vias and the FLASH transistor (1128) is coupled to Vss (1115) through redundant vias. No memory cell is coupled to BLB (1312). During a read operation, the BL (1010) is precharged to a high voltage (near Vdd) and BLB (1312) is held at a reference voltage which is usually a voltage approximately half way between Vdd and Vss (ground) (e.g. ½ Vdd). If the floating gate is programmed, then the FLASH transistor (1128) will not turn on when the wordline (1008) is selected. Therefore, the voltage on BL (1010) will remain at Vdd. In this case, a differential voltage of about ½ Vdd will be applied across the differential inputs (1001) and (1003) of differential sense amplifier (1002), with the input (1003) at approximately Vdd and the input (1001) at approximately ½ Vdd. If, however, the floating gate of FLASH transistor (1128) is erased, then the FLASH transistor (1128) will turn on when the WL (1008) is selected. Therefore, the BL (1010) will discharge to Vss (1115). In this case, a differential voltage of about ½ Vdd is also applied across the differential inputs—but in the opposite direction. The voltage on input (1003) is approximately 0 volts (Vss) and the voltage on input (1001) is again at about ½ Vdd; therefore, the differential amplifier latches in the opposite state, thus reading the opposite logic state when activated by signals applied to sense amp enable (1006) and sense amp enable bar (1004). In a conventional 1T FLASH memory, the high resistance of an individual via between an erased conventional FLASH transistor and the BL (1010) or between an erased conventional FLASH transistor and Vss (1115) during a read operation may cause the rate of BL (1010) discharge to be sufficiently slowed so that an insufficient differential voltage is developed across the inputs of the differential sense amplifier to latch it in the proper state. This may result in a read error. Since only about half of the differential voltage may be developed across the differential inputs when a 1T FLASH memory is read (compared to when a 2T FLASH memory is read), the 1T FLASH memory may be more susceptible to read errors if there is high resistance in the bitline discharge path. A re-layout of the conventional FLASH memory bit may enable redundant vias to be added without increasing the area of FLASH bit 1128.

Figure 2:
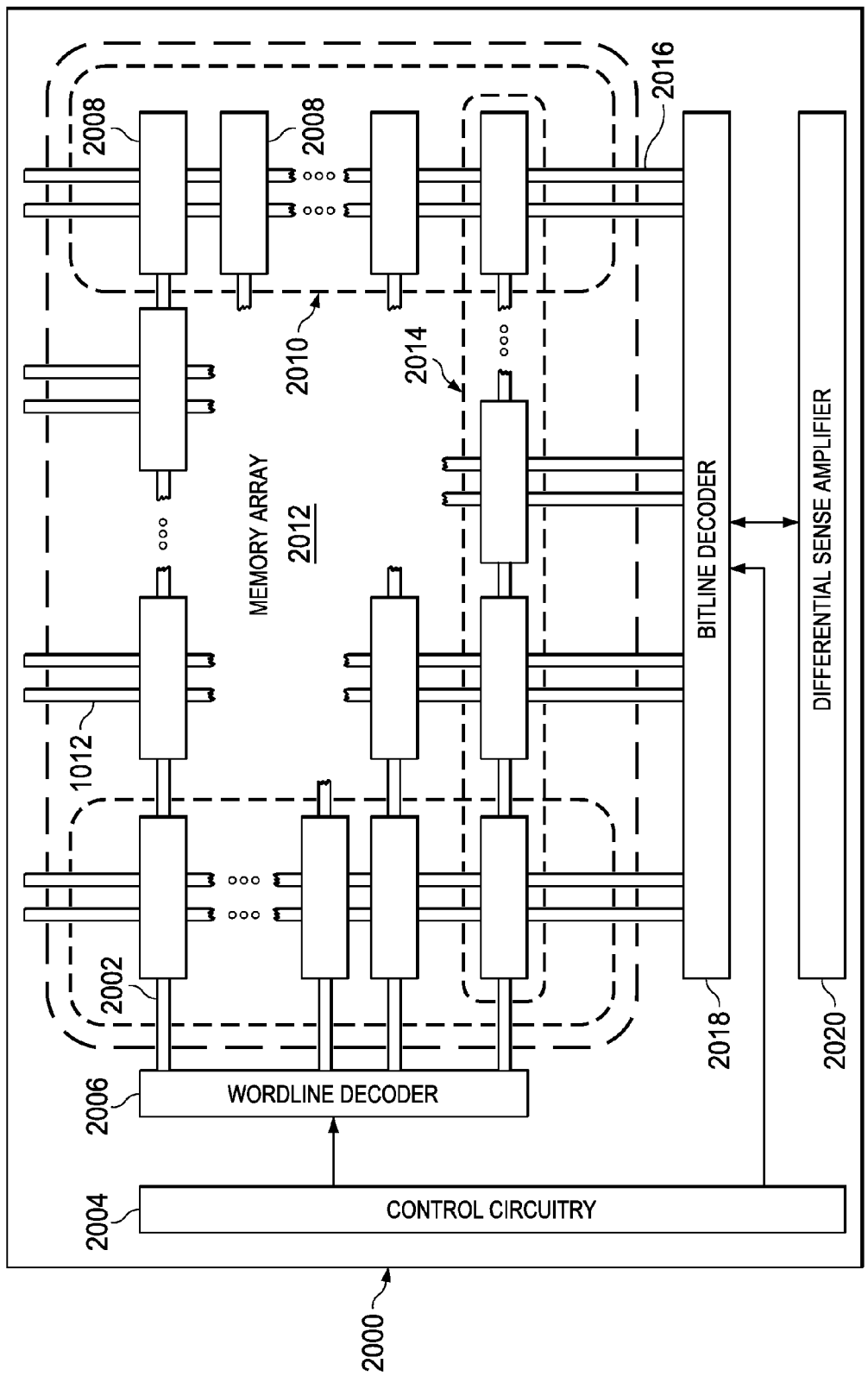
FIG. 2 is an example memory array with memory bits, wordline and bitline decoders and a differential sense amplifier.
Figure 6A:
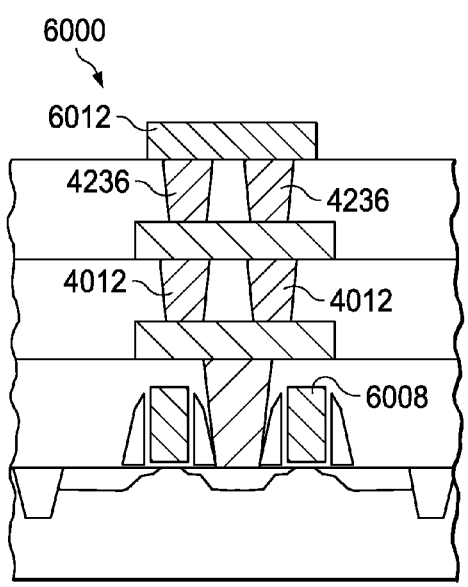
FIGS. 6A and 6B. show an example cross section through the bitline vias and the cell Vss vias of an SRAM with redundant vias formed according to an embodiment.
Figure 6B:
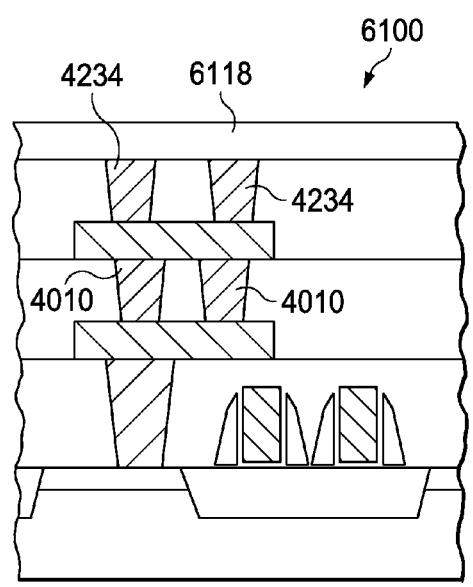

The memory illustrated in FIG. 2 (2000) may contain millions of bits (2008) with hundreds or thousands of bitlines (2016) and bitline vias. Structurally, the path that connects bitline (1010) in FIGS. 1A, 1B, and 1C to Vss (1015) (typically ground) may pass through a contact, a metal interconnect, and one or more vias in series (as shown in FIGS. 6A-6B and discussed infra). Occasionally one of the bitline vias may have high resistance due to process variation. When this happens, the rate of discharge of a BL or BLB (1012) to ground may be slowed resulting in a reduced voltage across the differential sense amplifier (2020). This reduced differential may result in a read error. The read error rate in memory bits with higher resistance bitline vias may increase at low operating temperatures. Generally, circuitry tends to increase in speed at low temperatures, so an undesirably high resistive via which extends the bitline discharge time may exacerbate read errors.

The example memory array circuit (2000) shown in FIG. 2 contains memory bits (2008) arranged in rows (2014) and columns (2010) within the memory array (2012). A series of wordlines (2002) connect the memory bits (2008) to the wordline decoder (2006) and a series of bitlines (2016) connect the memory bits (2008) to the bitline decoder (2018) which in turn are connected to the differential sense amplifiers (2020). Control circuitry (2004) sends signals to the wordline decoder and bitline decoder regarding the memory bit address and timing signals.

In the example embodiments discussed infra, the term "redundant via" refers to a second via which is electrically in parallel with a first via. In addition, the term "redundant via pair" refers to two or more vias that are electrically in parallel.

The term "bitline vias" refers to via-1s or via-2s that are in the path that connect the bitline to the memory cell. In an SRAM memory bit these vias may occur between the bitline and a SRAM pass transistor.

The term "Vss vias" may refer to either via-1s or via-2s that are in the path that connects the memory cell to Vss (ground). In an SRAM memory bit these vias may occur between the pulldown transistor and Vss (ground).

In some instances of integrated circuits containing a memory array having memory bits, substantially all circuits in the integrated circuit are dedicated to operation of the memory array. In these instances, circuits which provide data to be stored in the memory array and circuits which use data from the memory array are located outside the integrated circuit containing the memory array. In other instances of integrated circuits containing memory arrays (such as microprocessors, digital signal processors and wireless telephony controllers), circuits which provide data to be stored in the memory array and circuits which use data from the memory array are located in the integrated circuit containing the memory array.

Figure 3A:
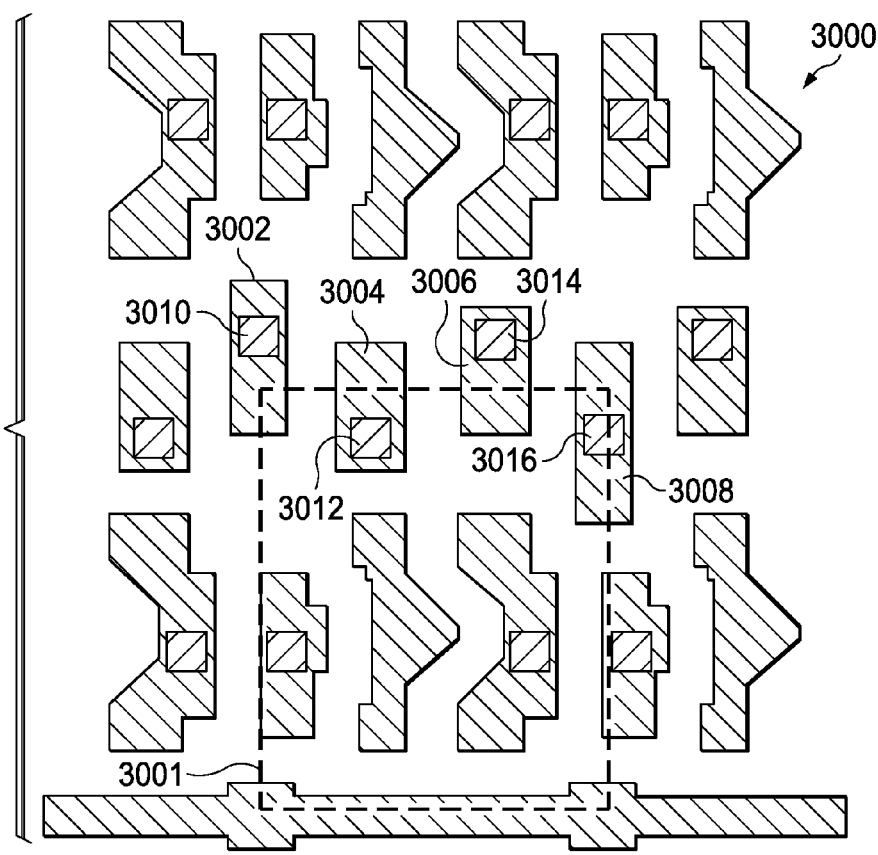
FIGS. 3A, 3B and 3C (Prior Art) are the metal-1 plus via-1, metal-2 plus via-1, and metal-2 plus via-2 patterns, respectively, in a conventional SRAM memory bit.

FIG. 3A illustrates the metal-1 and via-1 patterns (3000) of a conventional SRAM memory bit. In FIG. 3A, a metal-1 pattern of bitline via-1 landing pads (3004) and (3006) are bitline landing pads for bitline via-1's (3012) and (3014) respectively. Broken line (3001) indicates the border of one SRAM unit cell and is not pattern. In a differential read circuit, the current from the bitline (or bitline-bar) connected to a first input of a differential sense amplifier discharges through bitline via-1 (3012) and current from the other bitline (often called bitline-bar) connected to a second input of the differential sense amplifier discharges through bitline (or bitline-bar) via-1 (3014). Therefore, a memory array with a megabit of memory may have more than two million bitline via-1s. A bitline (or bitline-bar) via-1 that has a high resistance due to a process variation may slow the discharge of the bitline (or bitline-bar) during a read operation. As a result, the differential voltage across the inputs of the sense amp may be reduced and possibly cause a read error.

Figure 3B:
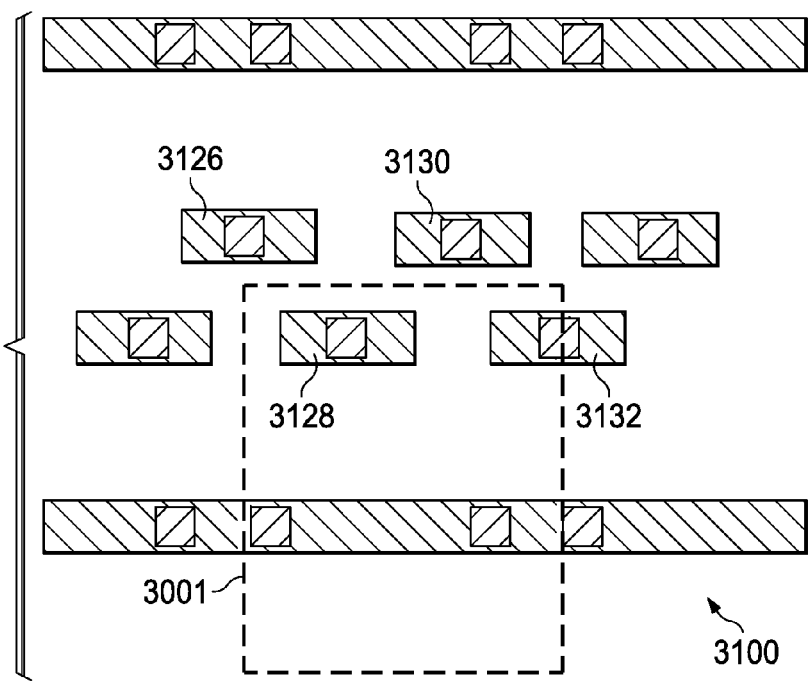
Figure 3C:
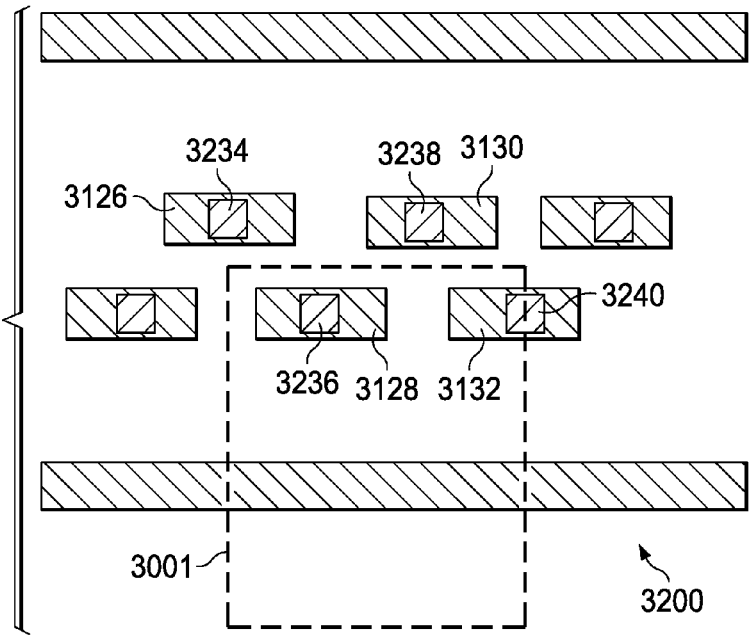
Figure 4A:
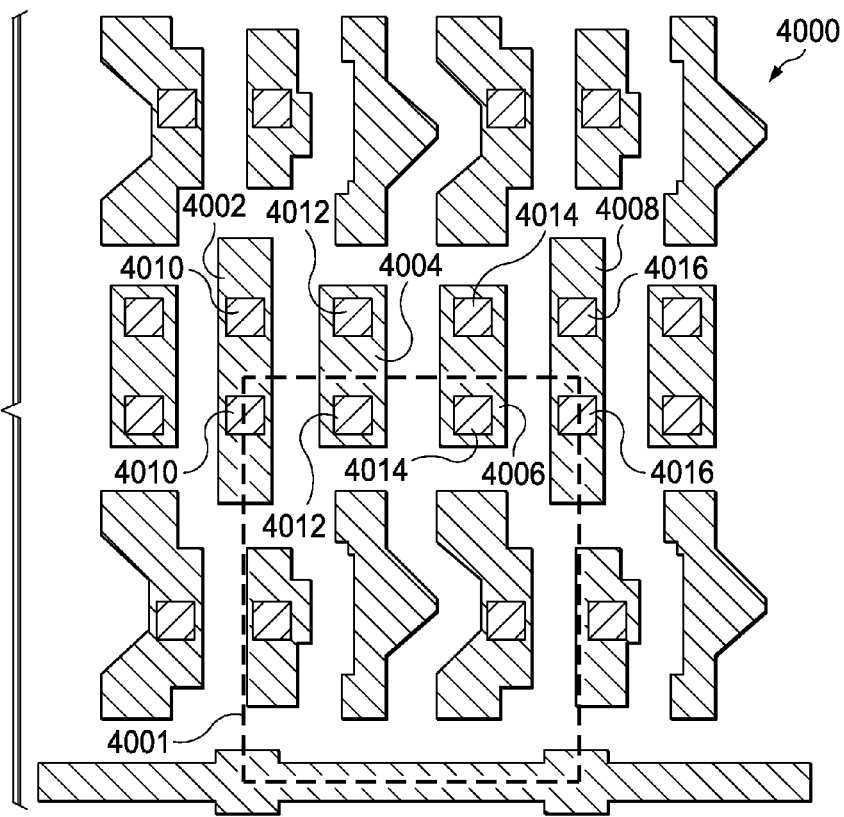
FIGS. 4A, 4B, and 4C are the metal-1 plus via-1, metal-2 plus via-1, and metal-2 plus via-2 patterns, respectively, in an SRAM memory bit according to an embodiment.

FIG. 4A illustrates the metal-1 and via-1 patterns (4000) of an embodiment SRAM memory bit. Redundant via-1 pairs, (4010), (4012), (4014) and (4016), replace non redundant vias (3010), (3012), (3014), and (3016) if FIG. 3 to form SRAM memory bit (4000). Bitline via-1 landing pads (3004) and (3006) in FIG. 3A have been modified to become bitline via-1 landing pads (4004) and (4006) in FIG. 4A to accommodate the redundant bitline via pairs (4012) and (4014). In this embodiment, the metal-1 landing pads and the redundant bitline via-1 pairs are added with no increase in the cell border area (4001). With redundant bitline via-1 pairs, the reliability of the read operation may be improved. If one of the bitline (or bitline-bar) via-1s (e.g. one of the via-1s in redundant via-1 pair 4012) has high resistance due to a process variation, the redundant bitline via-1 (e.g. the other of the via-1s in redundant via-1 pair 4012) may continue to provide a low resistance path to ground. Electrical current flows through these bitline via-1s from the BL (1010) to the passgate transistor (1026) and from BLB (1012) to passgate transistor (1018) as shown in FIG. 1A.

Single Vss via-1s (3010) and (3016) shown in FIG. 3A are in the path that discharges BL (1010) and BLB (1012) to ground. If the resistance of one of these vias is high the discharge rate may be reduced. These Vss vias also connect pulldown transistors (1022) and (1016) to ground (1015) as shown in FIG. 1A. Therefore, in another embodiment, the single Vss via (3010) in FIG. 3A is replaced with a redundant Vss via pair (4010) as shown in FIG. 4A and single Vss via (3016) is replaced with a redundant Vss via pair (4016). Metal-1 landing pads (3002) and (3008) in FIG. 3A are replaced with metal-1 landing pads (4002) and (4008) in FIG. 4A to accommodate the redundant Vss via pairs. These changes may be made with no increase in cell area (e.g. compare cell border (3001) in FIG. 3A with cell border (4001) in FIG. 4A).

The above embodiment was illustrated using metal-1 and via-1 patterns from an SRAM memory bit. However, the reliability of other memory bits that use differential reading operations, such as FLASH or FRAM, may also be improved with redundant vias.

Figure 4B:
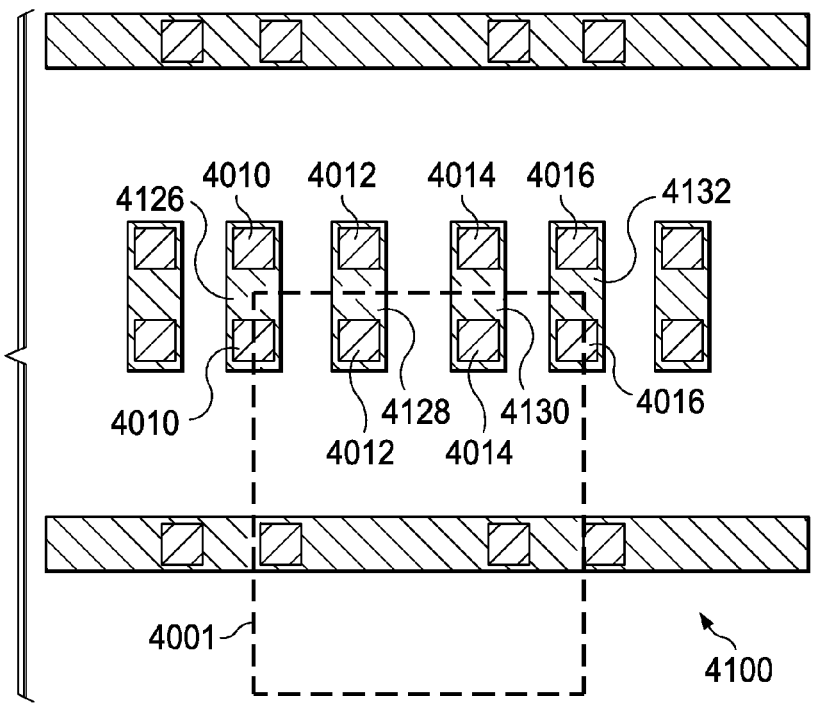

FIGS. 3B and 4B show the via-1 and metal-2 patterns, (3100) and (4100), of conventional and embodiment SRAM memory bits and illustrate changes that may be made to metal-2 to accommodate the addition of the redundant via-1s illustrated in FIG. 4A. In the example embodiment, the metal-2 landing pads (4126), (4128), (4130), and (4132) in FIG. 4B replace metal-2 landing pads (3126), (3128), (3130), and (3132) in FIG. 3B to accommodate the redundant via-1 pairs (4010), (4012), (4014), and (4016). The change to the metal-2 landing pads and the addition of redundant via-1s do not increase cell border area (4001) in this embodiment (as compared to cell border area (3001)).

Figure 4C:
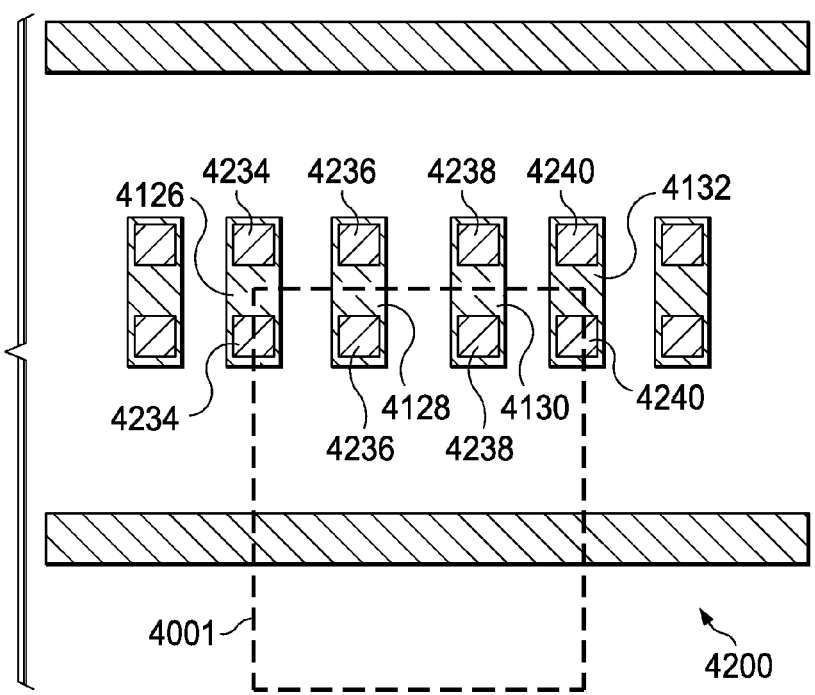

FIGS. 3C and 4C show the metal-2 and via-2 patterns, (3200) and (4200), of a conventional and embodiment SRAM memory bits and illustrate the addition of redundant bitline via-2s. The change that is made to the metal-2 geometries (4126), (4128), (4130), and (4132) in FIG. 4B to accommodate the addition of redundant via-1 pairs (4010), (4012), (4014), and (4016) in FIG. 4B, will also enable redundant via-2 pairs (4234), (4236), (4238), and (4240) illustrated in FIG. 4C. These redundant via pairs replace the single vias, (3034), (3236), (3248), and (3240) in the convention SRAM memory bit of FIG. 3C with no increase in area (e.g. compare cell area 4001 to cell area 3001).

As mentioned previously, a bitline in a conventional memory bit may discharge to ground through one or more individual vias that are connected in series. This is the case for the conventional SRAM memory bit shown in FIG. 3C. For example, bitline via-2 (3236) in FIG. 3C is in series with bitline via-1 (3012) in FIG. 3A. Referring to FIG. 1A, these two bitline vias may be in series between the BL (1010) and passgate transistor (1026). During a read operation, the BL (1010) may discharge through these two bitline vias in series if the gate of passgate transistor (1026) and the gate of pulldown transistor (1022) are turned on. Likewise individual Vss via-2 (3234) in FIG. 3C may be in series with individual Vss via-1 (3010) in FIG. 3A. Again referring to FIG. 1A, these two Vss vias may be in series between pulldown transistor (1022) and ground (1015). Therefore, during a read operation, BL (1010) may discharge serially through bitline via-2 (3236), bitline via-1 (3012), Vss via-1 (3010), and Vss via-2 (3234). In the example conventional SRAM memory bit, a bitline may discharge through the four individual vias that are in series. A high resistance on any of the individual vias may cause a read failure. Redundant via-2 pairs (4234), (4236), (4238), and (4240) replace individual via-2s (3234), (3236), (3238), and (3240) in FIG. 3C to improve SRAM read reliability according to this embodiment.

Figure 5A:
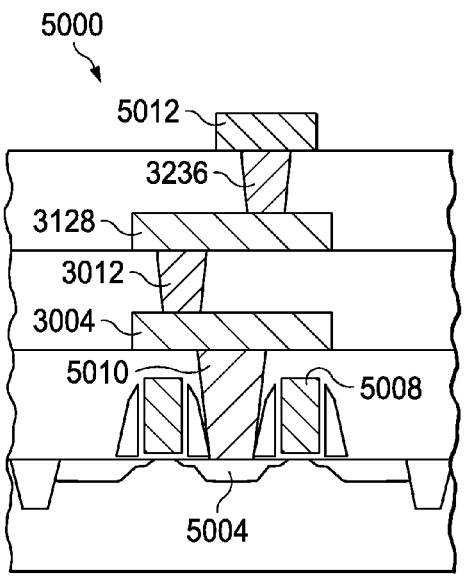
FIGS. 5A and 5B. (Prior Art) show an example cross section through the bitline vias and the cell Vss vias of an SRAM with non redundant vias.

FIG. 5A is an integrated circuit cross section (5000) of an SRAM through bitline via-1 (3012) and bitline via-2 (3236) in SRAM patterns shown in FIGS. 3A and 3C. The SRAM (5000) includes SRAM passgate transistor (5008), a bitline (5012), and a contact (5010) connecting passgate diffusion (5004) to metal-1 landing pad (3004). A single bitline via-1 (3012) connects the metal-1 landing pad (3004) to the metal-2 landing pad (3128). In addition, a single bitline via-2 (3236) connects the metal-2 landing pad (3128) to the metal-3 bitline (5012). When transistor (5008) turns on, the bitline (5012) discharges through passgate transistor (5008) to Vss serially through a via path comprised of the bitline via-2 (3236) and bitline via-1 (3012). If the via resistance of either via is high, then the discharge rate may be slowed causing a read failure.

FIG. 6A is an integrated circuit cross section (6000) of the SRAM patterns shown in FIGS. 4A and 4C. When passgate transistor (6008) turns on, the bitline (6012) discharges through passgate transistor (6008) to Vss serially through the redundant bitline via-2 pair (4236) and redundant bitline via-1 pair (4012). If the resistance of any of the vias is high, than the redundant via in the redundant via pair may continue to provide a low resistance path to ground, thereby preventing a read failure.

Figure 5B:
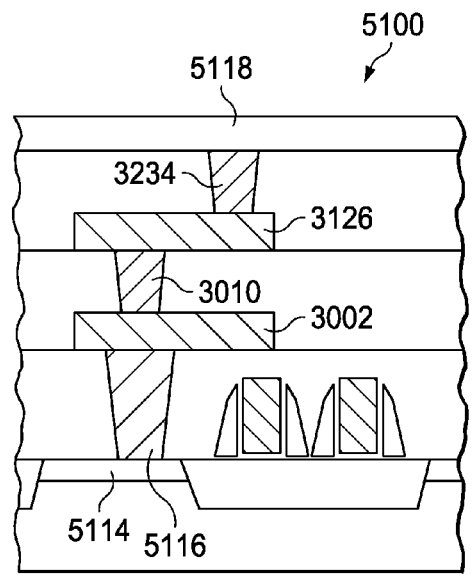

FIG. 5B is an integrated circuit cross section (5100) of an SRAM through Vss via-1 (3010) and Vss via-2 (3234) of the SRAM patterns shown in FIGS. 3A and 3C. A single Vss via-2 (3234) connects metal-3 Vss line (5118) to the metal-2 landing pad (3126) (see also FIG. 3C). In addition, a single Vss via-1 (3010) connects the metal-2 landing pad (3126) to the metal-1 landing pad (3002). The contact (5116) connects the metal-1 structure (3002) to diffusion (5114). During an SRAM read, the BL (5012) shown in FIG. 5A discharges to Vss (5118) shown in FIG. 5B. Therefore, the bitline discharges serially through a via path comprised of the bitline vias (3236) and (3012) to diffusion (5004). When SRAM passgate (5008) and SRAM pulldown (not shown) transistors turn on, the passgate diffusion (5004) in FIG. 5A is connected to the pass-gate diffusion (5114) in FIG. 5B. The charge then discharges serially through Vss vias (3010) and (3234) to Vss (5118). If any of these vias is high resistance, then the BL (5012) discharge rate may be slowed, thereby causing a read failure.

FIG. 6B is an integrated circuit cross section (6100) of an SRAM through redundant Vss via-1 pair (4010) and redundant Vss via-2 pair (4234) of the SRAM patterns shown in FIGS. 4A and 4C. During an SRAM read, the BL (6012) in FIG. 6A discharges to Vss (6118) in FIG. 6B serially through the redundant bitline via pairs, (4236) and (4012) shown in FIG. 6A and also serially through the redundant Vss via pairs (4010) and (4234) shown in FIG. 6B. If any of these vias is high resistance, then the redundant via in the redundant via pair may continue to provide a low resistance path to ground, thereby preventing a read failure.

Though a 6-T SRAM memory bit was used to illustrate the embodiment supra, other SRAM memory bits (such as an 8-T SRAM memory bit or a 4 transistor 2 resistor (4T2R) SRAM memory bit) may be used. Moreover, the yield and reliability of other memory bits—such as FLASH or FRAM—that employ differential sense amplification for read may also benefit from these embodiments.

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit, comprising:
a memory bit;
a differential sense amplifier coupled to said memory bit for reading a logic state of said memory bit;
a bitline connected to an input of said differential sense amplifier; and
a via path that couples said bitline to Vss wherein said via path contains at least one redundant via pair located within said memory bit.

2. The integrated circuit of claim 1 wherein said memory bit is a FLASH memory bit and said redundant via pair are at least one of a redundant via-1 pair and a redundant via-2 pair.

3. The integrated circuit of claim 2 wherein said redundant via-1 pair is a redundant bitline via-1 pair and wherein said redundant via-2 pair is a redundant bitline via-2 pair.

4. The integrated circuit of claim 2 wherein said redundant via-1 pair is a redundant bitline via-1 pair and a redundant Vss via-1 pair and wherein said redundant via-2 pair is a redundant bitline via-2 pair and a redundant Vss via-2 pair.

5. An integrated circuit, comprising:
an FLASH memory bit;
a differential sense amplifier coupled to said FLASH memory bit for reading a logic state of said FLASH memory bit;
a bitline coupled to an input of said differential sense amplifier and also coupled to said FLASH memory bit;
Vss coupled to said FLASH memory bit; and
a via path which couples said bitline to said Vss through said FLASH memory bit wherein said via path contains a redundant via pair located within said FLASH memory bit.

6. The integrated circuit of claim 5 wherein said redundant via pair is at least one of a redundant bitline via pair and a redundant Vss via pair.

7. The integrated circuit of claim 6 wherein said redundant bitline via pair is at least one of a redundant bitline via-1 pair and a redundant bitline via-2 pair and wherein said redundant Vss via pair is at least one of a redundant Vss via-1 pair and a redundant Vss via-2 pair.

8. The integrated circuit of claim 5 wherein said redundant via pair includes a redundant bitline via-2 pair, a redundant bitline via-1 pair, a redundant Vss via-1 pair, and a redundant Vss via-2 pair.

* * * * *